(12) United States Patent
Andre et al.

(10) Patent No.: US 10,199,122 B2
(45) Date of Patent: Feb. 5, 2019

(54) SHORT DETECTION AND INVERSION

(71) Applicant: Everspin Technologies Inc., Chandler, AZ (US)

(72) Inventors: Thomas Andre, Austin, TX (US); Jon Slaughter, Albany, NY (US); Dimitri Houssameddine, Gilbert, AZ (US); Syed M. Alam, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 15/852,678

(22) Filed: Dec. 22, 2017

(65) Prior Publication Data

US 2018/0122495 A1 May 3, 2018

Related U.S. Application Data

(63) Continuation of application No. 15/356,223, filed on Nov. 18, 2016, now Pat. No. 9,881,695, which is a continuation of application No. 14/502,287, filed on Sep. 30, 2014, now Pat. No. 9,502,089.

(51) Int. Cl.

| | |
|---|---|
| *G06F 7/02* | (2006.01) |
| *H03M 13/00* | (2006.01) |
| *G11C 29/50* | (2006.01) |
| *G11C 11/16* | (2006.01) |
| *G06F 11/08* | (2006.01) |
| *G06F 11/10* | (2006.01) |
| *G11C 29/04* | (2006.01) |

(52) U.S. Cl.
CPC .............. *G11C 29/50* (2013.01); *G06F 11/08* (2013.01); *G06F 11/1048* (2013.01); *G11C 11/1673* (2013.01); *G11C 2029/0411* (2013.01)

(58) Field of Classification Search
CPC ........ G11C 11/1673; G11C 2029/0411; G11C 7/12; G11C 7/18; G11C 11/4097; G11C 29/02; G11C 29/025; G11C 11/4094; G11C 11/401; G11C 2207/005; G11C 7/1006; G11C 11/4078; G11C 11/406; G11C 2211/4062; G11C 29/765; G06F 11/08; G06F 11/106
See application file for complete search history.

(56) References Cited

U.S. PATENT DOCUMENTS

| | | |
|---|---|---|
| 4,455,654 A | 6/1984 | Bhaskar et al. |
| 5,172,339 A | 12/1992 | Noguchi et al. |

(Continued)

OTHER PUBLICATIONS

PCT Search Report and Written Opinion dated Jan. 4, 2016, for PCT Application No. PCT/US15/52855, 10 pages.

(Continued)

*Primary Examiner* — Guerrier Merant
(74) *Attorney, Agent, or Firm* — Bookoff McAndrews, PLLC

(57) ABSTRACT

In some examples, a memory device may be configured to store data in either an original or an inverted state based at least in part on a state associated with one or more shorted bit cells. For instance, the memory device may be configured to identify a shorted bit cell within a memory array and to store the data in the memory array, such that a state of the data bit stored in the shorted bit cell matches the state associated with the shorted bit cell.

20 Claims, 9 Drawing Sheets

(56) References Cited

U.S. PATENT DOCUMENTS

| | | | |
|---|---|---|---|
| 5,504,760 A * | 4/1996 | Harari | G11C 16/10 |
| | | | 365/190 |
| 5,606,528 A | 2/1997 | Ikeda | |
| 5,742,557 A | 4/1998 | Gibbons et al. | |
| 6,295,619 B1 | 9/2001 | Hasbun et al. | |
| 9,502,089 B2 | 11/2016 | Andre et al. | |
| 9,881,695 B2 | 1/2018 | Andre et al. | |
| 2005/0265079 A1 | 12/2005 | Shirota | |
| 2006/0285410 A1 | 12/2006 | Hummler | |
| 2007/0025154 A1 | 2/2007 | Yano et al. | |
| 2007/0183232 A1 | 8/2007 | Okada | |
| 2009/0097322 A1 | 4/2009 | Iioka | |
| 2012/0198313 A1 | 8/2012 | Alam et al. | |
| 2013/0061102 A1 | 3/2013 | Sohn et al. | |
| 2013/0124942 A1 * | 5/2013 | Franca-Neto | G06F 11/1008 |
| | | | 714/766 |
| 2014/0146625 A1 | 5/2014 | Kurjanowicz et al. | |
| 2014/0164873 A1 | 6/2014 | Guyot et al. | |
| 2014/0215121 A1 | 7/2014 | Ordentlich et al. | |
| 2014/0281725 A1 * | 9/2014 | Karidis | G06F 11/0751 |
| | | | 714/37 |
| 2014/0372792 A1 | 12/2014 | Slaughter et al. | |
| 2015/0058698 A1 | 2/2015 | Lee et al. | |
| 2016/0093354 A1 | 3/2016 | Andre et al. | |

OTHER PUBLICATIONS

European Search Report dated on Mar. 20, 2018, for EP Application No. 15845671.5, 6 pages.

* cited by examiner

SHORT DETECTION AND INVERSION

CROSS-REFERENCE TO RELATED APPLICATION(S)

This application is a continuation of pending U.S. application Ser. No. 15/356,223, filed Nov. 18, 2016, which is a continuation of U.S. application Ser. No. 14/502,287, filed on Sep. 30, 2014, (now U.S. Pat. No. 9,502,089, issued Nov. 22, 2016), each of which is incorporated herein by reference in its entirety.

BACKGROUND

In magnetic memory devices, such as magnetic random access memory (MRAM) devices, the bit error rate may be higher than a comparable non-magnetic memory devices, such as dynamic random access memory (DRAM) devices. In some instances, the higher bit error rate of MRAM devices is related to dielectric breakdown of the magnetic tunnel junctions used to store the data within the memory arrays. In some particular cases, the rate of dielectric breakdown may be the limiting factor for the endurance or lifetime of the MRAM device.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
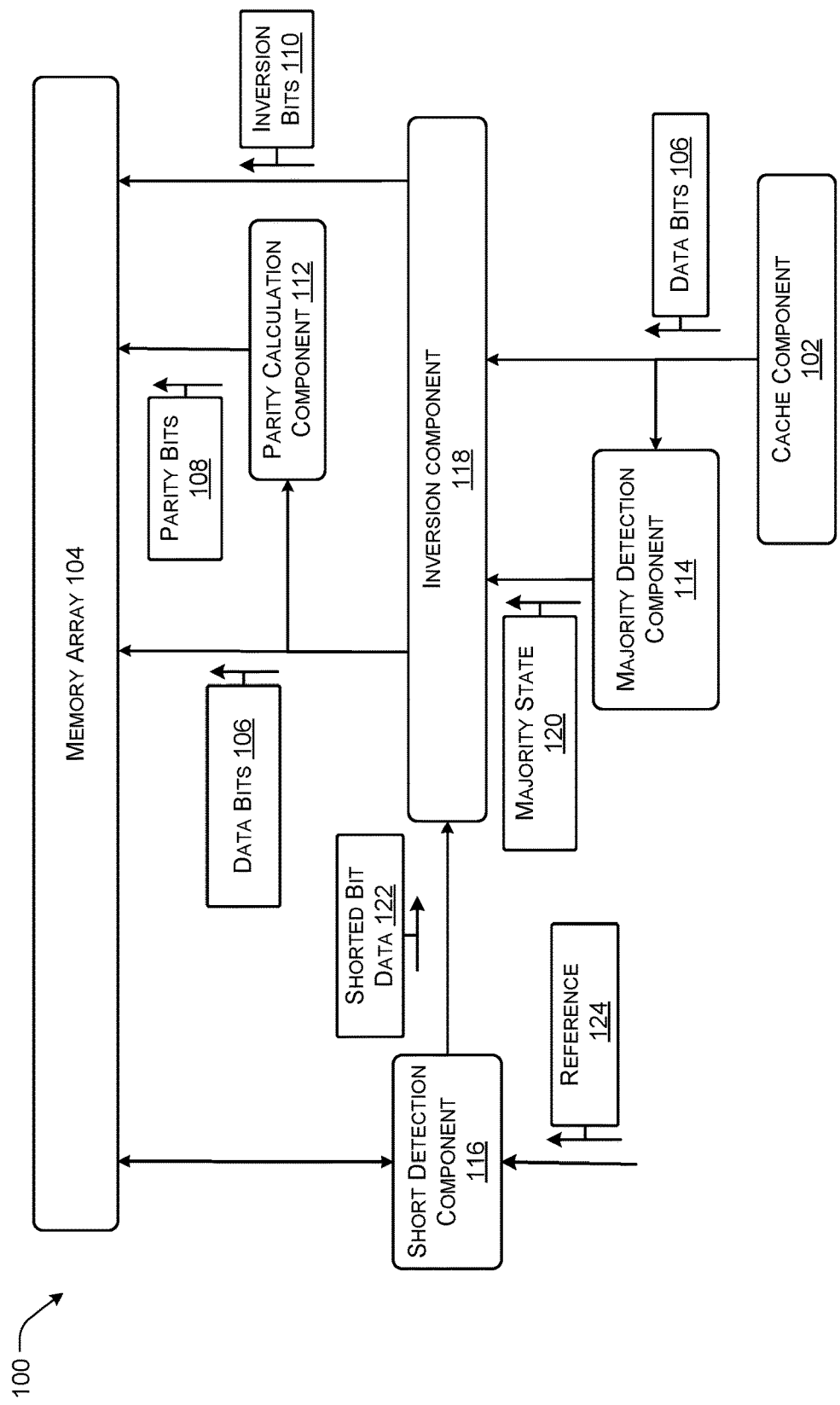
FIG. 1 illustrates a block diagram showing select components of a memory device according to some implementations.

This disclosure includes techniques and implementations to improve the reliability and energy consumption rates associated with accessing data stored in memory devices. For example, in some types of magnetic memory devices the data is stored by maintaining a desired state on a magnetic tunnel junction (MTJ) or a differential state between pairs of MTJs. The states of each bit of the memory device are typically set or switched by applying a voltage across a corresponding MTJ. Unfortunately, repeatedly applying voltages across the MTJs may, in some cases, lead to dielectric breakdown of the tunnel barrier, thereby causing the bit cell to exhibit a very low impedance (e.g., the restive state of the bit cell may become fixed or the bit cell may become shorted) and/or a reduced impedance associated with a partial breakdown. In some cases, depending on the data stored (e.g., data associated with the opposite state of the fixed state bit cell), the shorted bit cell may introduce an error when the data is accessed.

In some implementations, a memory device may be configured with an error correction circuit capable of correcting a single error within an error correction code (ECC) word of a memory array when the data is read. In some instances, the error correction circuit is able to correct for the error introduced by the shorted bit cell. However, when the error correction circuit is used to correct the error associated with the shorted bit cell, the error correction circuit is unable to correct for other inherent random errors that may occur within the ECC word of the memory array. Therefore, the likelihood of errors being output by the memory device increases. Further, if a second bit cell of the same ECC word also experiences dielectric breakdown over time, the error correction circuit may be unable to compensate.

Therefore, in some implementations, described herein, a short detection circuit may be incorporated into the memory array to detect the shorted bit cell and, in some cases, compensate for the shorted bit cell before the data is output to an external source, thereby extending the usable lifetime of the memory device. For example, the memory device may be configured to utilize one or more inversion bits to store the data in the memory arrays in a manner that a state of the data (either in an original state or an inverted state) stored in the shorted bit cell matches the fixed state of the shorted bit cell.

For instance, in some implementations, the memory device described herein may be configured to implement self-referenced reads, which may require switching or setting each bit cell to a predetermined state when the data stored in the memory arrays are loaded into a cache. For example, in some types of memory devices, following the completion of operations to load stored data into cache bits, each bit cell in the memory array associated with the data read may be set to zero or placed in a low resistive state.

Further, during operations to store the data in the cache bit in the bit cells of the memory array, the memory device may perform a majority detection on the bits stored in the cache before storing the bits in the memory array. The majority detection may determine if a larger number of the bits are zero (e.g., in a low resistive state) or if a larger number of the bits are ones (e.g., in a high resistive state). In these implementations, if the memory device determines that more of the bits are ones than zeros, the memory device may invert a state of each of the bits associated with the data, set an inversion bit, and write the inverted bits and the inversion bit into the memory array. By inverting the bits when a greater number of ones are detected, the memory device is able to switch fewer bits (as the bits in the memory array were set to zero following the completion of the operations to load stored data into cache bits). As such, the memory device may experience improved energy consumption associated with writing data into the array, as on average fewer bit cells.

However, in some cases, such as when a short is detected, rather than inverting the data based on a majority detection scheme to improve power consumption, the data bits may be inverted to ensure that the data stored in the shorted bit cell is stored in the appropriate state. For example, if the shorted bit cell is fixed in the low resistive state and the corresponding data bit is representative of a low value, the data may be stored in the memory array in the original or non-inverted state. Alternatively, if the shorted bit cell is fixed in the low resistive state and the corresponding bit of data is representative of a high value, the data may be inverted and the inversion bit set before storing the data in the memory array. In this manner, the shorted bit no longer generates an error allowing the memory device to continue operating within desired parameters for a longer period of time. In addition, the error correction circuit is freed up to identify and correct other errors that may be introduced.

In another instance, a second and/or third bit cell of the same ECC word, may also experience dielectric breakdown over time and become fixed in the low resistive state or short. In this example, assume the first shorted bit cell has data to store in the high resistive state and the second and third shorted bit cells have data to store in the low resistive state. In this example, the short detection component may detect and invert based on any one of the shorted bit cells identified having data to store in the high state. For instance, with the first shorted bit cell having data to be stored in the high state, the memory device may set an inversion bit and store the data into the memory array in the inverted state, as a low resistance state of the data to store in the first shorted bit cell matches the fixed state of the first shorted bit cell. In this example, both the second and third shorted bit cells store an inverted state which represents the high resistance state and may read an incorrect state and introduce errors when the data is output by the memory device. In the present example, the error correction circuit may be utilized to correct one of the errors introduced by the second or third shorted bit cells. However, the second error introduced by the second or third shorted bit cells may be output to the external source causing an error.

In another example, the short detection component and/or the majority detection component may be configured to identify each shorted bit (e.g., the first, second, and third shorted bit cells) and to perform a majority detection on a state associated with the data bit corresponding to each of the first, second, and third shorted bit cells and the fixed state of each shorted bit cell to identify whether inverting or not inverting results in a greater number of matches. Thus, the short detection component may detect the first, second, and third shorted bit cells, identify that the second and third shorted bit cells are associated with data to store in the low state, and store the original or non-inverted data in the memory array. In this manner, the short detection and inversion scheme using a majority of the states associated with the shorted bits corrects the two errors that would have otherwise been introduced with respect to the second and third shorted bit cells, as described above. However, the inversion scheme now results with an error associated with the data stored in the first shorted bit cell (e.g., the value of the data to store in the first shorted bit was the original or non-inverted high state). However, in this example, the error correction component may be able to correct the single error introduced by the first shorted bit cell, resulting in a memory device that may operate correctly even with three shorted bits cells associated with the same ECC word.

In some cases, the error rates associated with reading and writing data to and from a magnetic memory device may be greater than the error rates associated with reading and writing data in other types of memory devices. In these cases, the magnetic memory device may include more robust error correction circuits, for example double error correction may be implemented. Thus, in some implementations, increasing the number of the errors that are correctable by the error correction component may further increase the endurance or usable lifetime of the memory device, particularly when the majority detection and inversion scheme described above is utilized. For example, if triple error correction is utilized, the memory device may be able to operate within normal parameters with up to seven shorted bit cells associated with the same ECC word.

FIG. 1 illustrates a block diagram showing select components of a memory device 100 according to some implementations. In the illustrated example, data stored in a cache component 102 is being written back into a memory array 104. In general, the memory device 100 is an example of tangible non-transitory computer storage media and may include volatile and nonvolatile memory and/or removable and non-removable media for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processors.

The memory device 100 includes one or more memory arrays, such as memory array 104. The memory array 104 may be configured to store data arranged in ECC words that include data bits 106, parity bits 108 (or check bits), and/or inversion bits 110. The data bits 106 contain data to be stored in the memory array 104. The parity bits 108 are utilized to determine whether an error has occurred with respect to the data bits 106 and parity bits 108 and inversion bits 110. The inversion bits 110 indicate whether the data bits 106 and/or the parity bits 108 are stored in an original state or in an inverted state.

The memory device 100 includes a parity calculation component 112, a majority detection component 114, and a short detection component 116, and an inversion component 118. The parity calculation component 112 may be configured to generate parity bits 108 based at least in part on a state of each of the data bits 106 being stored in the memory array 104 from the cache component 102. The stored parity bits 108 may then be utilized by the memory device 100 when the data bits 106 are read from the memory array 104 to identify any errors associated with the stored data, as will be described in more detail with respect to FIG. 2 below.

The majority detection component 114 may be configured to determine the most common state or majority state 120 associated with the data bits 106. For example, the majority detection component 114 may determine whether the data bits 106 represent more zeros or more ones and select the more commonly occurring state as the majority state 120. The majority detection component 114 may then provide the majority state to the inversion component 118 for use in determining whether or not to store the data bits 106 in the original state (e.g., the non-inverted state) or in an inverted state.

In the illustrated example, the short detection component 116 is configured to have direct access to the bit cells of the memory array 104 and to a reference 124 (e.g., a reference voltage, reference resistance, a referenced current, etc.) in order to identify if any of the bit cells associated with the data bits 106 are shorted or have a fixed state. For example, the short detection component may identify a short by comparing a sample voltage associated with individual bit cells of the memory array 104 to a reference voltage. In another example, the short detection component 116 may identify a short by comparing a resistance associated with individual bit cells of the memory array 104 to a reference resistance. The short detection component 116 outputs shorted bit data 122 that may be utilized by the inversion component 118 in addition to the majority state 120 to determine whether or not to store the data bits 106 in the original state (e.g., the non-inverted state) or in an inverted state. In some cases, the shorted bit data 122 may include state information associated with each bit cell sampled (e.g., an identification that the bit cell is fixed in the high resistive state or in the low resistive state). In other cases, the shorted bit data 122 may output a high signal indicative of a short on the bit cell and/or a low signal indicative of a bit cell operating under normal parameters.

The inversion component 118 may be configured to receive the data bits 106 from the cache component 102, the majority state 120 from the majority detection component 114, and the shorted bit data 122 from the short detection component 116 to determine whether or not to store the data bits 106 in an original (e.g., non-inverted) state or in an inverted state. The inversion component 118 may then set the one or more inversion bits 110 to a state representative of how the data was stored in the memory array 104 (e.g., either inverted or non-inverted).

In a first example, the shorted bit data 122 may indicate that each bit cell being written to is operating under normal parameters or that no shorted bit cells were identified. In this example, the inversion component 118 may receive the majority state 120 (e.g., either one or zero) and store the inverted data bits 106 when the majority state is one and the non-inverted data bits 106 when the majority state is zero. For instance, in some cases, the memory device 100 may implement self-referenced read operations, which cause each of the bit cells to be set to a low resistive state representative of the value zero when the data is loaded into the cache component 102. In this instance, the inversion component 118 inverts the data bits 106 in order to cause a larger portion of the data bits 106 to be stored as a zero, thus reducing the number of bit cells that are switched.

Alternatively, in other cases, the memory device 100 may implement self-referenced read operations, which cause each of the bit cells to be set to a high resistive state representative of the value one when the data is loaded into the cache component 102. Thus, the inversion component 118 may store the inverted data bits 106 when the majority state is zero and the non-inverted data bits 106 when the majority state is one to once again ensure that a smaller portion of the bit cells are switched to the opposing state (e.g., in this example, to the low resistive state).

In another example, the shorted bit data 122 may indicate one of the bit cells being utilized to store the data bits 106 may be shorted. In this example, the inversion component 118 may compare the fixed state of the shorted bit cell to a state of the data bit being stored in the shorted bit cell. When the fixed state of the shorted bit cell matches the state of the data bit (e.g., both are high or both are low), the inversion component 118 stores the data bits 106 in the original or non-inverted state. Otherwise, when the fixed state of the shorted bit cell is the opposite of the state of the data bit (e.g., one is high and one is low), the inversion component 118 stores the data bits 106 in the inverted state. In this manner, the memory device 100 may continue to operate correctly even though a short has occurred with respect to a bit cell, thereby extending the usable life of the memory device 100.

In yet another example, the shorted bit data 122 may identify both a first shorted bit cell and a second shorted bit cell. In this example, the inversion component 118 may select one of the shorted bit cells (e.g., either the first shorted bit cell or the second shorted bit cell) and invert the data based on a comparison of the fixed state of the selected shorted bit cell and a state of the corresponding data bit being stored in the selected shorted bit cell, as discussed above. In this example, the memory device 100 is able to compensate for at least one of the shorted bit cells by storing the data bits 106 in a manner to match the state of at least one of the shorted bit cells. Additionally, in some cases, the non-selected shorted bit cell may still introduce an error when the data is read from the array. For instance, an error may be introduced when both the first and second shorted bit cells are fixed in the low resistive state and the data bit corresponding to the first shorted bit cell is high and the data bit corresponding to the second shorted bit cell is low. In these cases, the second error may be corrected by error correction component (not shown), such that the memory device 100 may continue to operate correctly despite having two shorted bit cells within the same ECC word.

In one particular example, the shorted bit data 122 may identify three or more shorted bit cells. In this example, the inversion component 118 (or alternately, the majority detection component 116) may perform a majority detection on a state of each data bit 106 being stored in a shorted bit cell to identify a majority state associated with the data being stored in the shorted bit cells. In some cases, the inversion component (or alternately, the shorted detection component 116) may identify a state associated with the shorted bit cells. In memory arrays in which each shorted bit cell has the same fixed state (e.g., the low resistive state), the inversion component 118 may store the non-inverted data bits 106. For example, the inversion component 118 may store the non-inverted data bits 106 when the majority state of the data being stored in the shorted bit cells is zero and the shorted state is the low resistive state or when the majority state of the data being stored in the shorted bit cells is one and the shorted state is the high resistive state. Alternatively, the inversion component 118 may store the inverted data bits 106 when the majority state of the data being stored in the shorted bit cells is zero and the shorted state is the high resistive state or when the majority state of the data being stored in the shorted bit cells is one and the shorted state is the low resistive state.

In some cases, the fixed state of each shorted bit cell may differ (e.g., some bit cells are fixed in the high state and some bit cells are fixed in the low state). In these cases, the inversion component 118 may perform a series of compares to identify if storing the data bits 106 in the non-inverted state or in the inverted state results in fewer data bits being stored incorrectly. In the examples in which three or more bit cells are shorted, the inversion component 118 may compensate for some portion of the errors that would otherwise be introduced, while the error correction component on the memory device 100 may be utilized to compensate for additional errors based on the type of error correction being implemented. For instance, the memory device 100 may include error correction component capable of correcting one, two, three, or more errors which would allow the memory device 100 to continue to function correctly even given three, five, or seven shorted bit cells, respectively. Furthermore, some systems have additional system level error correction that may be capable of correcting one, two, three, or more errors in addition to the errors corrected by the error correction component on board the memory device 100. In this manner, the memory device 100 may appear to operate correctly through, for instance, as many as thirteen shorted bit cells within one ECC word.

Figure 2:
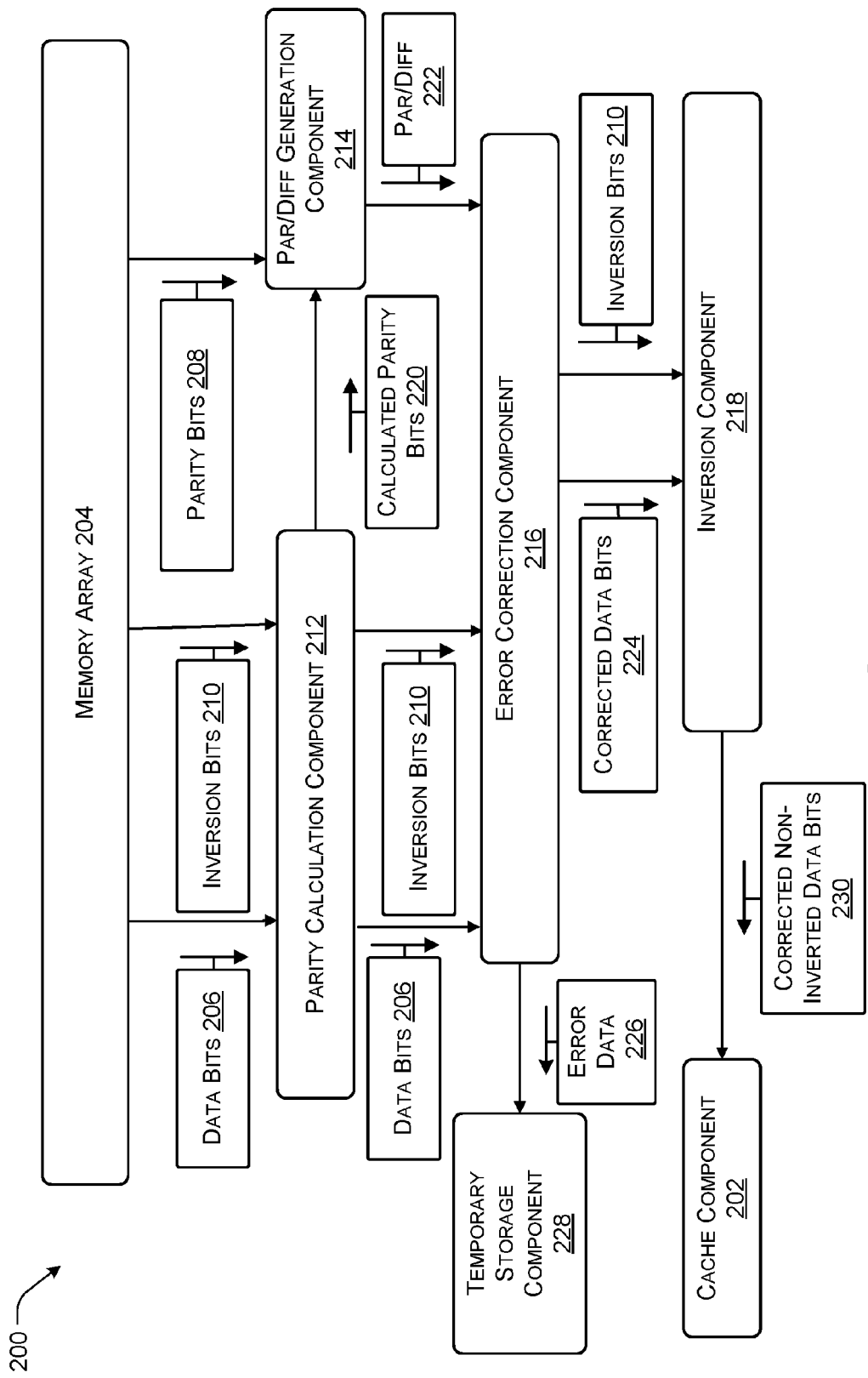
FIG. 2 illustrates a block diagram showing select components of a memory device according to some implementations.

FIG. 2 illustrates a block diagram showing select components of a memory device 200 according to some implementations. In the illustrated example, data stored in the memory array 204 is being accessed and loaded into a cache component 202. In general, the memory array 204 may be configured to store data according to ECC words, which may include the data bits 206, the parity bits 208 (or check bits), and/or the inversion bits 210. The data bits 206 represent the data being accessed. The parity bits 208 may be utilized by the memory device 200 to determine whether an error has occurred during a read or write operation associated with the data bits 206. The inversion bits 210 are used to indicate whether the data bits 206 are stored in a non-inverted state or in an inverted state.

The memory device 200 includes a parity calculation component 212, a parity/difference generation component 214, an error correction component 216, and an inversion component 218. The parity calculation component 212 may be configured to generate calculated parity bits 220 based at least in part on the data bits 206 received from the memory array 204 and to provide the calculated parity bits 220 to the parity/difference generation component 214. The parity/difference generation component 214 may be configured to generate a parity/difference 222 based at least in part on the parity bits 208 and calculated parity bits 220. For example, the parity/difference generation component 214 may compare the values associated with each of the calculated parity bits 220 with the corresponding values of the stored parity bits 208 to calculate the parity/difference 222.

The error correction component 216 is configured to correct or switch the bits having an error as indicated by the parity/difference information 222 in order to generate corrected data bits 224 before the data bits 206 are output to the cache component 202 for access by an external source. In the illustrated example, the error correction component 216 may also be configured to output error data 226 to a temporary storage component 228, such as a latch. The temporary storage component 228 may then store the error data 226 until the data is written back into the memory array 204 from the cache component 202, as will be described in more detail below with respect to FIG. 3.

The inversion component 218 may be configured to receive the corrected data bits 224 and the inversion bits 210 and to invert the corrected data bits 224 when the inversion bits 210 indicate that the data bits 206 were inverted when stored in the memory array 204. In this manner, the memory device 200 is able to output corrected non-inverted data bits 230 in the state upon which the data bits 206 were received by the cache component 202 at the time the data bits 206 were stored in the memory array 204.

Figure 3:
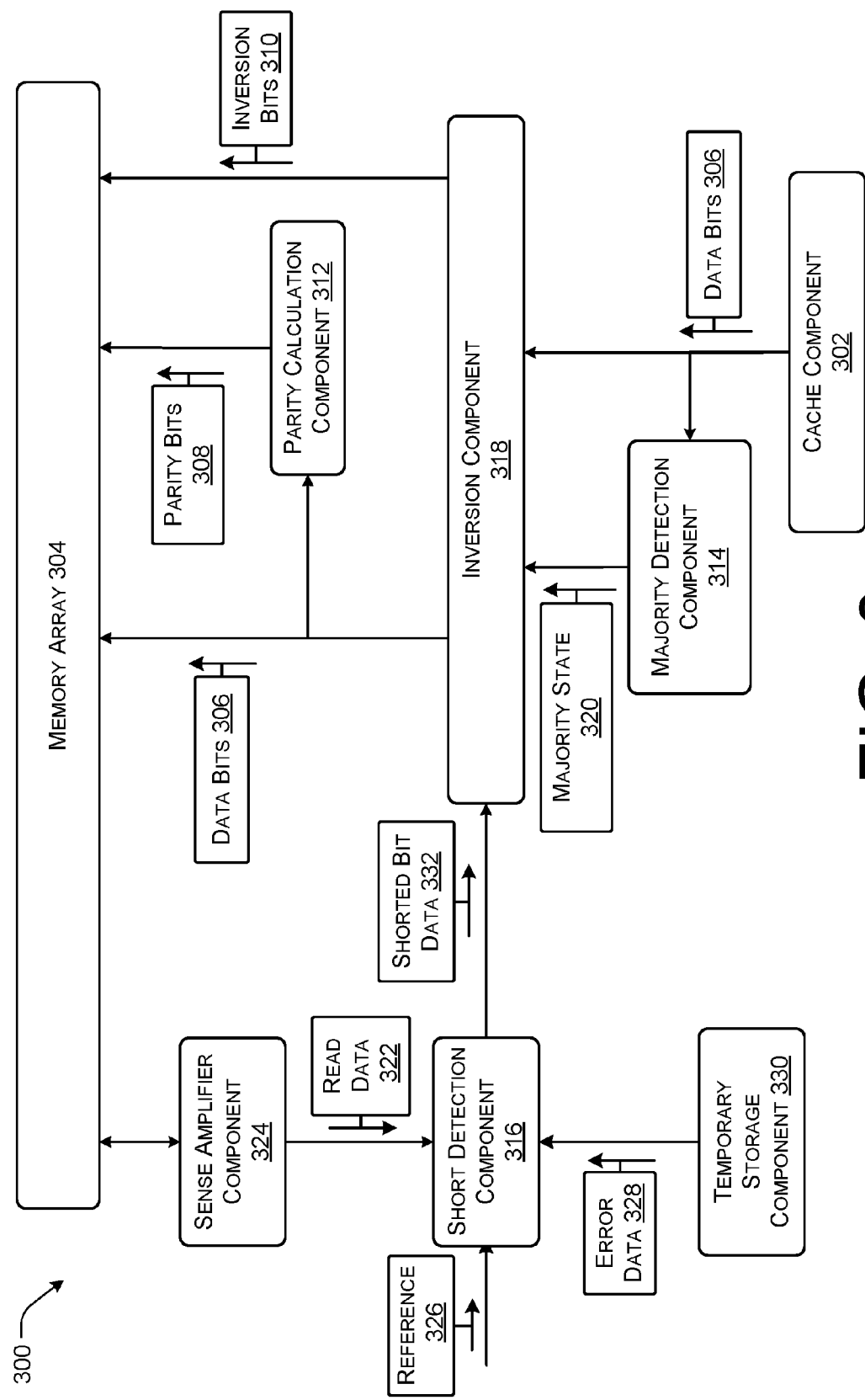
FIG. 3 illustrates a block diagram showing select components of a memory device according to some implementations.

FIG. 3 illustrates a block diagram showing select components of a memory device 300 according to some implementations. In the illustrated example, data stored in a cache component 302 is being written back into a memory array 304. For example, an external source may be writing data into the memory array 300, in the manner described above with respect to FIG. 1.

In general, the memory device 300 includes one or more memory arrays, such as memory array 304. The memory array 304 may be configured to store data arranged in ECC words that include data bits 306, parity bits 308 (or check bits), and/or inversion bits 310. The data bits 306 contain data to be read from the memory array 304. The parity bits 308 are utilized to determine whether an error has occurred with respect to the data bits 306. The inversion bits 310 indicate whether the data bits 306 and/or the parity bits 308 are stored in an original state or in an inverted state.

The memory device 300 includes a parity calculation component 312, a majority detection component 314, a short detection component 316, and an inversion component 318. The parity calculation component 312 may be configured to generate parity bits 308 based at least in part on a state of each of the data bits 306 being stored in the memory array 304 from the cache component 302. The stored parity bits 308 may then be utilized by the memory device 300 when the data bits 306 are read from the memory array 304 to identify any errors associated with the stored data, as described above respect to FIG. 2.

The majority detection component 314 may be configured to determine the most common state or majority state 320 associated with the data bits 306. For example, the majority detection component 314 may determine whether the data bits 306 represent more zeros or more ones and select the more commonly occurring state as the majority state 320. The majority detection component 314 may then provide the majority state to the inversion component 318 for use in determining whether or not to store the data bits 306 in the original state (e.g., the non-inverted state) or in an inverted state.

In the illustrated example, the short detection component 316 is configured to receive read data 322 from a sense amplifier component 324, a reference signal 326 indicative of an expected shorted state of individual bit cells, and error data 328 from a temporary storage component 330 collected when the data bits 306 were loaded into the cache component 302. The short detection component 316 may be configured to utilize the read data 322, the reference signal 326, and the error data 328 to identify if any of the bit cells associated with the data bits 306 are shorted or have a fixed state. For instance, if the read data 322 from the sense amplifier 324 and the reference signal 326 indicate a particular bit cell is in a state associated with a short and the error data 328 indicates that the error correction component (not shown) detected an error with the data stored on the particular bit cell, the short detection component 316 may identify the particular bit cell as shorted. If a short state of the particular bit cell is the low resistive state (indicated by the reference signal 326) and the state of the bit cell identified by the sense amplifier 324 is also the low resistive state (indicated by the read data 322), it is likely that the particular bit cell is shorted if the particular bit cell contained an error when the data was loaded into the cache component 302 (indicated by the error data 328). Once the shorted bit cells are identified, the short detection component 316 may output shorted bit data 332 to the inversion component 318.

In some cases, the bit cells of the memory array 304 may be shorted or fixed in different states (e.g., some in a high resistive state and some in a low resistive state). In these cases, the reference signal 326 may differ based on the expected short state for each of the bit cells of the memory array 304. For example, the reference signal 326 may be a higher reference voltage or resistance when the short is expected to fix the bit cell in the high resistive state and a lower reference voltage or resistance when the short is expected to fix the bit cell in the low resistive state. In this manner, the short detection component 316 may be able to detect shorted bit cells regardless of the fixed state associated with each shorted bit cell.

The inversion component 318 may be configured to receive the data bits 306 from the cache component 302, the majority state 320 from the majority detection component 314, and the shorted bit data 332 from the short detection component 316 to determine whether or not to store the data bits 306 in an original (e.g., non-inverted) state or in an inverted state. The inversion component 318 may set the one or more inversion bits 310 to a state representative of how the data was stored in the memory array 304 (e.g., either inverted or non-inverted).

In a first example, the shorted bit data 332 may indicate that each bit cell being written to is operating under normal parameters. In this example, the inversion component 318 may receive the majority state 320 (e.g., either one or zero) and store the inverted data bits 306 when the majority state is one and the non-inverted data bits 306 when the majority state is zero. For instance, in some cases, the memory device 300 may implement self-referenced read operations, which cause each of the bit cells to be set to a low resistive state representative of the value zero when the data is loaded into the cache component 302. In this instance, the inversion component 318 inverts the data bits 306 in order to cause a larger portion of the data bits 306 to be stored as a zero, thus reducing the number of bit cells that need to be switched.

Alternatively, in other cases, the memory device 300 may implement self-referenced read operations, which cause each of the bit cells to be set to a high resistive state representative of the value one when the data is loaded into the cache component 302. Thus, the inversion component 318 may store the inverted data bits 306 when the majority state is zero and the non-inverted data bits 306 when the majority state is one to once again ensure that a smaller portion of the bit cells are switched to the opposing state (e.g., in this example, to the high resistive state).

In another example, the shorted bit data 332 may indicate one of the bit cells being utilized to store the data bits 306 may be shorted. In this example, the inversion component 318 may compare the fixed state of the shorted bit cell to a state of the data bit being stored in the shorted bit cell. When the fixed state of the shorted bit cell matches the state of the data bit (e.g., both are high or both are low), the inversion component 318 stores the data bits 306 in the original or non-inverted state. Otherwise, when the fixed state of the shorted bit cell is the opposite of the state of the data bit (e.g., one is high and one is low), the inversion component 318 stores the data bits 306 in the inverted state. In this manner, the memory device 300 may continue to operate correctly even though a short has occurred with respect to a bit cell, thereby extending the usable life of the memory device 300.

In yet another example, the shorted bit data 332 may identify both a first shorted bit cell and a second shorted bit cell. In this example, the inversion component 318 may select one of the shorted bit cells (e.g., either the first shorted bit cell or the second shorted bit cell) and invert the selected shorted bit cells based on a comparison of the fixed state of the selected shorted bit cell and a state of the corresponding data bit being stored in the selected shorted bit cell, as discussed above. In this example, the memory device 300 is able to compensate for at least one of the shorted bit cells by storing the data bits 306 in a manner to match the state of at least one of the shorted bit cells. Additionally, in some cases, the non-selected shorted bit cell may still introduce an error when the data is read from the memory array 304. For instance, an error may be introduced when both the first and second shorted bit cells are fixed in the low resistive state and the data bit corresponding to the first shorted bit cell is high and the data bit corresponding to the second shorted bit cell is low. In these cases, the second error may be corrected by error correction component (not shown), such that the memory device 300 may continue to operate correctly despite having two shorted bit cells within the same ECC word.

In one particular example, the shorted bit data 332 may identify three or more shorted bit cells. In this example, the inversion component 318 (or alternately, the majority detection component 316) may perform a majority detection on a state of each data bit 306 being stored in a shorted bit cell to identify a majority state associated with the data being stored in the shorted bit cells. In some cases, the inversion component (or alternately, the shorted detection component 316) may identify a state associated with the shorted bit cells. The inversion component 318 may then store the non-inverted data bits 306 when the majority state of the data being stored in the shorted bit cells is zero and the shorted state is the low resistive state or when the majority state of the data being stored in the shorted bit cells is one and the shorted state is the high resistive state. The inversion component 318 may then store the inverted data bits 306 when the majority state of the data being stored in the shorted bit cells is zero and the shorted state is the high resistive state or when the majority state of the data being stored in the shorted bit cells is one and the shorted state is the low resistive state.

In some particular examples, preforming write back operations to switch a state of a shorted bit cell from the fixed state may cause a voltage stress along the word line associated with the shorted bit cell. In some cases, the voltage stress along the word line may accelerate a breakdown (e.g., an oxide breakdown) of a select transistor associated with activating the word line. In these cases, the memory device 300 may be configured to mask the shorted bit cell during the write operations or prevent the write operation from being applied with respect to the shorted bit cells.

For instance, in one example, the memory array includes three shorted bit cells fixed in the low resistive state and data bits to be written to the first and second shorted bit cells represent the high resistive state and data bits to be written to the third shorted bit cell represent the low resistive state. In this example, the memory device 300 may perform the majority detection on the state of the data bits and the fixed state of the shorted bit cells, as described above, and determine that the data bits should be stored in the inverted state. Thus, the first and second shorted bit cells are stored in the correct state but the third shorted bit cell would have a write voltage applied to attempt to switch the state.

In this example, instead of performing the write operations on the third shorted bit cell (which may cause the voltage stress on the select transistor of the word line associated with the third shorted bit cell), the memory device 300 may mask the third shorted bit cell to prevent the write voltage from being applied. In some cases, masking the third shorted bit cell may include preventing the write operations associated with the third shorted bit cell from being initiated or preformed. In other cases, masking the third shorted bit cell may include blocking or preventing the write voltage from being applied to the tunnel junction of the third shorted bit cell. Thus, by masking the third shorted bit cell, the memory device 300 avoids the stress condition on the word line and reduces the rate at which the gate oxide of the select transistor breaks down. In other examples, the memory device 300 may mask each of the shorted bit regardless of the state of the data bits being written to each.

In some cases, the fixed state of each shorted bit cell may differ (e.g., some bit cells are fixed in the high state and some bit cells are fixed in the low state). In these cases, the inversion component 318 may perform a series of compares to identify if storing the data bits 306 in the non-inverted state or in the inverted state results in fewer data bits being stored incorrectly. In the examples, in which three or more bit cells are shorted, the inversion component 318 may compensate for some portion of the errors that would otherwise be introduced, while the error correction component (either memory device level or system level) may be utilized to compensate for additional errors based on the type of error correction being implemented. For instance, the memory device 300 may include error correction component capable of correcting one, two, three, or more errors which would allow the memory device 300 to continue to function correctly even given three, five, or seven shorted bit cells, respectively. Furthermore, some systems have additional system level error correction that may be capable of correcting one, two, three, or more errors in addition to the errors corrected by the error correction component on board the memory device 100. Thus, in some examples, the memory device 300 may appear to operate correctly with, for instance, as many as thirteen shorted bit cells associated with the same ECC word.

Figure 4:
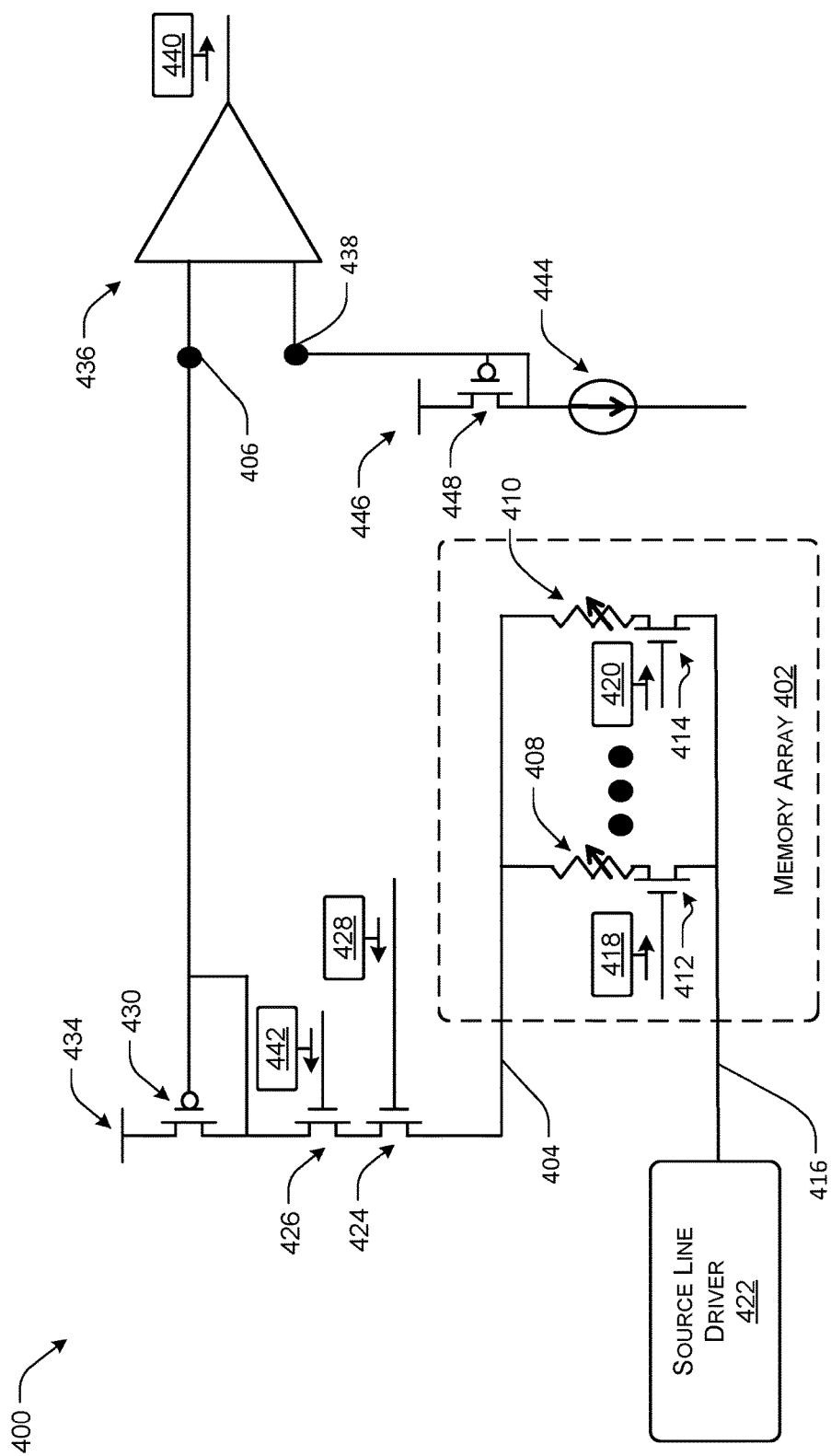
FIG. 4 illustrates a diagram showing an example short detection component according to some implementations.

FIG. 4 illustrates a diagram showing an example short detection component 400 according to some implementations. For example, the short detection component 400 may be incorporated into the memory device 100 of FIG. 1. In general, the short detection component 400 may be coupled to the memory array 402 via the bit line 404 in order to generate a sampled voltage at the node 406 representative of the resistive state of the particular bit cell being sampled.

In the illustrated example, the memory array 402 includes a first bit cell or resistive element 408 and a second bit cell or resistive element 410. In some examples, the first bit cell 408 and the second bit cell 410 may have a variable resistance configured by applying a voltage across a tunnel junction or magnetic tunnel junction (MTJ) associated with the bit cell. For example, the resistive state of the bit cell may be set to a low resistive state by a voltage in a first direction and to a high resistive state by applying a voltage in a second direction opposite the first direction. For instance, in some cases the resistive state of the bit cell may be set to the low resistive state by applying a down voltage or a voltage from the top of the MTJ to the bottom of the MTJ and to a high resistive state by applying an up voltage or a voltage from the bottom of the MTJ to the top of the MTJ. In some particular examples, the first bit cell 408 and the second bit cell 410 may be formed by a differential pair of variable resistive elements, either or both of which may experience dielectric breakdown and introduce errors into the data stored on the respective bit cell 408 or 410. In the illustrated example, a first and second bit cell 408 and 410 are illustrated, however, it should be understood that the memory array 402 may include any number of bit cells organized into any number of ECC words.

In general, the first bit cell 408 includes a first electrode coupled to the bit line 404 and a second electrode coupled to a first electrode of an NMOS switch transistor 412. Similarly, the second bit cell 410 includes a first electrode coupled to the bit line 404 and a second electrode coupled to a first electrode of an NMOS switch transistor 414. The NMOS switch transistor 412 also has a second electrode coupled to a source line 416 and a gate configured to receive a word line voltage 418. The NMOS switch transistor 414 also has a second electrode coupled to the source line 416 and a gate configured to receive a word line voltage 420. In the illustrated example, a source line driver 422 is connect to the source line 416 for providing a bias voltage along the source line 416 when the data stored on the first bit cell 408 and the second bit cell 410 is being accessed. For example, the source line driver 422 may include one or more PMOS follower circuits (not shown).

The bit line 404 is further coupled to a first electrode of a NMOS switch transistor 424. The NMOS switch transistor 424 also includes a second electrode coupled to a first electrode of a NMOS switch transistor 426 and a gate for receiving an enable voltage 428. A PMOS transistor 430 has a first electrode coupled to a power source 434. The NMOS switch transistor 426 includes a second electrode that is connected to a second electrode of the PMOS transistor 430 and a gate of the PMOS transistor 430 and a gate for receiving a bias voltage 442.

A comparator 436 has a first electrode coupled to the node 406 for receiving the sample voltage, a second electrode coupled to a node 438, and an output electrode for outputting an output signal 440 indicative of the resistive state of the particular bit cell being sampled. The node 438 is connected to a first electrode and a gate of a PMOS transistor 448. The node 438 is also coupled to a reference current, generally indicated by 444 and the PMOS transistor 448 includes a second electrode coupled to a power source 446 for driving a reference voltage to the node 438 based at least in part on a value associated with the reference current 444. In this manner, the comparator 436 may be configured to output a high signal 440 in response to detecting a short (e.g., when the sample voltage on the node 406 is further from the power source 434 than the reference voltage at the node 438 is from the power source 446) and a low signal 440 otherwise (e.g., when the sample voltage on node 406 is closer to the power source 434 than the reference voltage at node 438 is to the power source 446).

In one example, the first bit cell 408 may be shorted. In this example, the NMOS switch transistor 424 activates in response to the enable voltage 428, and the NMOS switch 412 activates in response to the wordline voltage 418, while the source line driver 422 and the bias voltage 442 applied to the NMOS switch transistor 426 generates a current that represents the resistance associated with the first bit cell 408. The current is reflected by the PMOS transistor 430 which generates a sample voltage onto the node 406. At the same time, the current reference 442 generates a reference voltage on the node 438 representative of the current associated with the reference current 444. The comparator 436 compares the voltage on the node 406 with the voltage on the node 438 and since, in this example, the first bit cell 408 is shorted, the voltage on the node 406 is further from power source 434 than node 438 is from power source 446. Therefore, the comparator 436 outputs the signal 440 in a state indicating that the first bit cell 408 is shorted.

Figure 5:
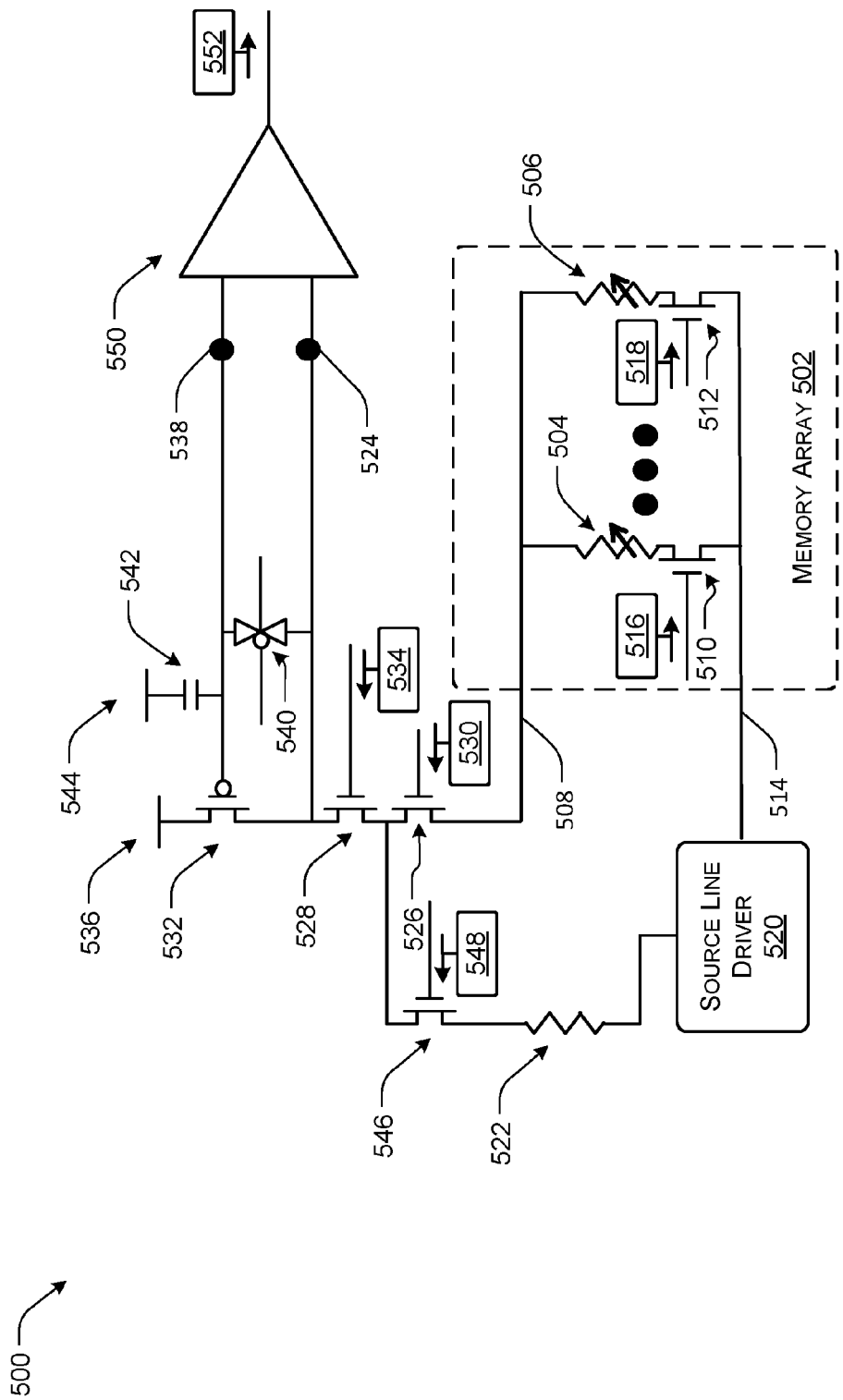
FIG. 5 illustrates a diagram showing an example short detection component according to some implementations.

FIG. 5 illustrates a diagram showing an example short detection component 500 according to some implementations. In this example, the short detection component 500 is configured to identify shorts on bit cells by comparing a sampled reference voltage representing a reference resistance to an evaluation voltage representation of the resistance on a particular bit cell of the memory array 502. In the illustrated example, the memory array 502 includes a first bit cell or resistive element 504 and a second bit cell or resistive element 506.

The first bit cell 504 and the second bit cell 506 may have a variable resistance configured by applying a voltage across a tunnel junction or magnetic tunnel junction (MTJ) associated with the bit cell. For example, the resistive state of the bit cell may be set to a low resistive state by a voltage in a first direction and to a high resistive state by applying a voltage in a second direction opposite the first direction. For instance, in some cases the resistive state of the bit cell may be set to the low resistive state by applying a down voltage or a voltage from the top of the MTJ to the bottom of the MTJ and to a high resistive state by applying an up voltage or a voltage from the bottom of the MTJ to the top of the MTJ. In some particular examples, the first bit cell 504 and the second bit cell 506 may be formed by a differential pair of variable restive elements, either or both of which may experience dielectric breakdown and introduce errors into the data stored on the respective bit cell 504 or 506. In the illustrated example, a first and second bit cell 504 and 506 are illustrated, however, it should be understood that the memory array 502 may include any number of bit cells organized into any number of ECC words.

In general, the first bit cell 504 includes a first electrode coupled to a bit line 508 and a second electrode coupled to a first electrode of an NMOS switch transistor 510. Similarly, the second bit cell 506 includes a first electrode coupled to the bit line 508 and a second electrode coupled to a first electrode of an NMOS switch transistor 512. The NMOS switch transistor 510 also has a second electrode coupled to a source line 514 and a gate configured to receive a word line voltage 516. The NMOS switch transistor 512 also has a second electrode coupled to the source line 514 and a gate configured to receive a word line voltage 518.

In the illustrated example, a source line driver 520 is connected to the source line 514 for providing a bias voltage along the source line 514 when the data stored on the first bit cell 504 and/or the second bit cell 506 is being accessed. For example, the source line driver 520 may include one or more PMOS follower circuits (not shown). The source line driver 520 is also coupled to a first electrode of a reference resistance 522 for generating a voltage reference on a node 524.

The bit line 508 is further coupled to a first electrode of a NMOS switch transistor 526. The NMOS switch transistor 526 also includes a second electrode coupled to a first electrode of a NMOS switch transistor 528 and a gate for receiving an enable voltage 530. The NMOS switch transistor 528 includes a second electrode coupled to a first electrode of a PMOS transistor 532 and a first electrode of a transmission gate 540 and a gate for receiving a bias voltage 534. The PMOS transistor 532 has a second electrode coupled to a power source 536 and a gate coupled to a second electrode of the transmission gate 540. A first electrode of a capacitor 542 is coupled to a gate of the PMOS transistor 532 and to the second electrode of the transmission gate 540. A second electrode of the capacitor 542 is coupled to a power source 544. In general, the capacitor 542 stores the sample voltage representative of the resistive state of the particular resistance being sampled.

The resistive reference 522 has a second electrode coupled to a first electrode of a NMOS switch transistor 546. The NMOS switch transistor 546 has a second electrode coupled to second electrode of NMOS switch transistor 526 and a gate for receiving reference enable voltage 548.

A comparator 550 has a first electrode coupled to the node 538 for receiving the sample voltage, a second electrode coupled to a node 524 for receiving the evaluation voltage, and an output electrode for outputting an output signal 552 indicative of the relative resistive state of the particular bit cell being sampled. In this manner, the comparator 550 may be configured to output a high signal 552 in response to detecting a short (e.g., when the sample voltage on the node 538 is closer the power source 536 than the evaluation voltage at the node 524) and a low signal 552 otherwise (e.g., when the sample voltage on the node 538 is further from the power source 536 than the evaluation voltage at the node 524).

In general, the short detection device 500 has two phases associated with detecting a short on a particular bit cell. To illustrate, if in a particular example, the bit cell 504 is shorted. During the first phase, the NMOS switch transistor 526 activates in response to the enable voltage 530, while the source line driver 520 and the bias voltage 534 applied to the NMOS switch transistor 528 generates a current that represents the resistance associated with the reference resistance 522. Additionally, the transmission gate 540 is activated and a sample voltage reflective of the current generated by the reference resistance 522 may be stored on the capacitor 542 and, thus, available at the node 538, during the second phase.

At the start of the second phase, the transmission gate 540 is deactivated to isolate the sample voltage stored on the capacitor 542 and available at the node 538 from the node 524. Likewise, the NMOS switch transistor 526 is disabled to also isolate the reference resistance 522 from the node 524. At the same time, the NMOS switch transistor 510 is enabled by the enable voltage 516 and the source line driver 520 and the bias voltage 534 on the gate of the NMOS switch transistor 528 generates a reference voltage representing the resistance of the first bit cell 504. Thus, the evaluation voltage is available at the node 524 and the sample voltage stored on the capacitor 542 is available at the node 538. In this manner, the comparator 550 may be able to compare the sample voltage to the reference voltage in order to generate the output signal 552. Thus, in the present example, the comparator 550 may output a high signal 552 indicating that the bit cell 504 is shorted.

Figure 6:
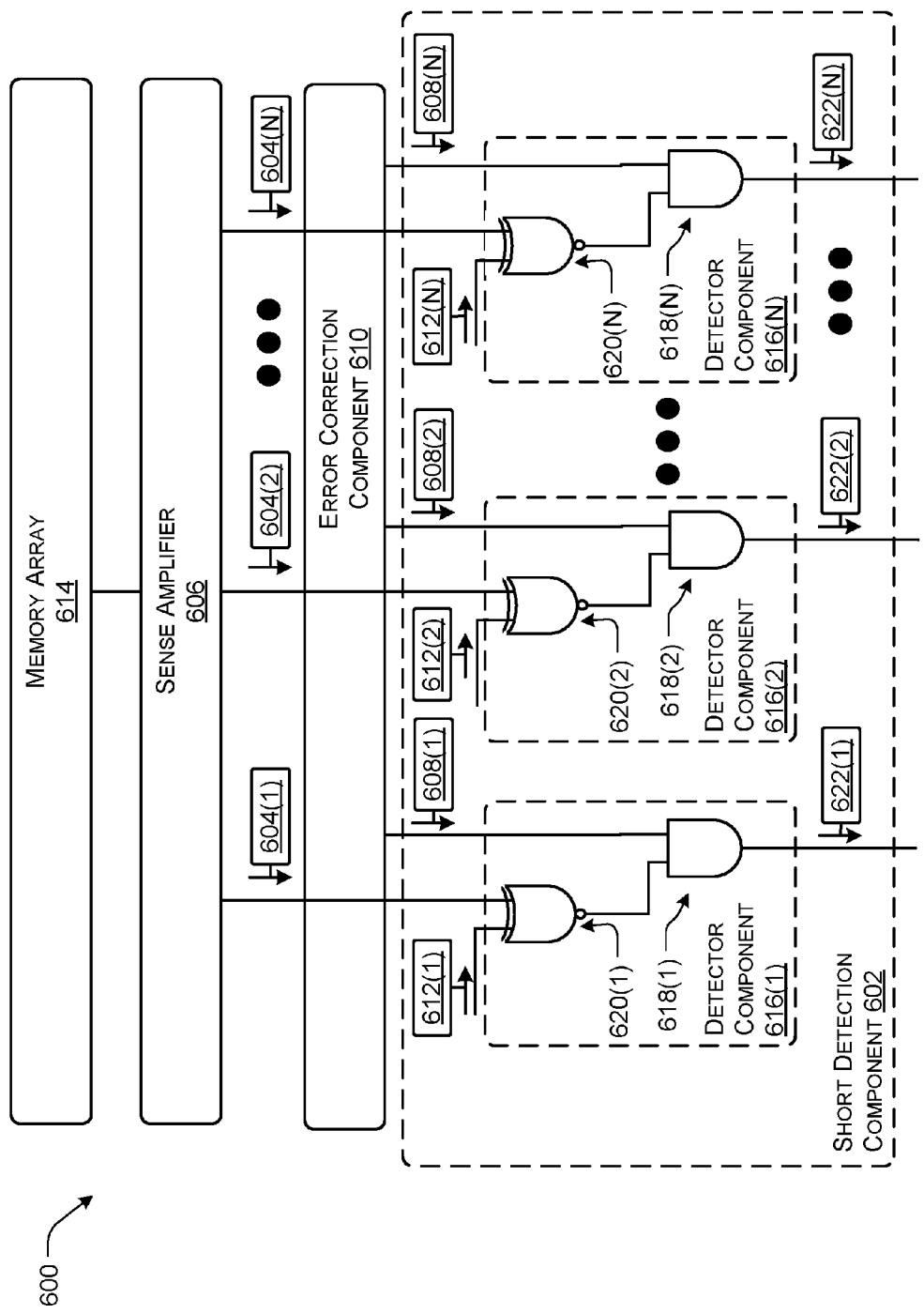
FIG. 6 illustrates a diagram showing an example short detection component according to some implementations.

FIGS. 4 and 5 illustrate example analog short detection components 400 and 500, respectively. FIG. 6 illustrates an example digital short detection component that may be utilized in some of the implementations described herein.

FIG. 6 illustrates a diagram 600 showing an example short detection component 602 according to some implementations. As described above with respect to FIG. 3, the short detection component 602 may be configured to identify shorts based in part on read data 604(1)-(N) received from the sense amplifier 606, error data 608(1)-(N) received from an error correction component 610 (for example, via a temporary storage element or component as illustrated with respect to FIGS. 2 and 3), and reference data 612(1)-(N) representative of an expected short state of each of the bit cells of the memory array 614 being accessed.

In general, the short detection component 602 includes a series of detector components 616(1)-(N) for identifying a short associated with each of the N bit cells corresponding to the data being written or associated with a particular ECC word. Each of the detector components 616(1)-(N) includes a corresponding AND gate 618(1)-(N) and a corresponding XNOR gate 620(1)-(N). The corresponding AND gate 618(1)-(N) may be configured to generate an output shorted bit data 622(1)-(N) indicative of an operating state of the corresponding bit cell.

For instance, in a first example, a first bit cell corresponding to read data 604(1) is operating correctly and the expected short state is a low resistive state. In this example, the reference data 612(1) is low and the read data 604(1) may be high or low depending on the state of the data stored in the first bit cell. If the read data 604(1) is high then the output of the XNOR gate 620(1) is low, and, thereby the output of the AND gate 618(1) is low indicting that the first bit cell is operating correctly. Otherwise, if the read data

604(1) is low, the output of the XNOR gate 620(1) is high. However, the error data 608(1) received from the error correction component 610 is low unless an error occurred. Thus, the output of the AND gate 618(1) is again low or indicating that the first bit cell is operating correctly.

In an alternate example, the first bit cell is shorted and the expected short state is still a low resistive state. In this example, the reference data 612(1) is low and the read data 604(1) is low, as the first bit cell is fixed in the low resistive state. Thus, the output of the XNOR gate 620(1) is high. Additionally, the error data 608(1) received from the error correction component 610 may be high or low depending on the state of the data stored in the first bit cell. For example, if the first bit cell was to store a value equal to a low resistive state, the error data 608(1) will be low, as the fixed state of the shorted bit cell and the state of the data is the same. However, if the first bit cell was to store a value corresponding to a high resistive state, the error data 608(1) will be high, as the shorted bit cell stores a low resistive state. In this case, the output of the AND gate 618(1) is high or indicating that the bit cell (1) is shorted.

Figure 7:
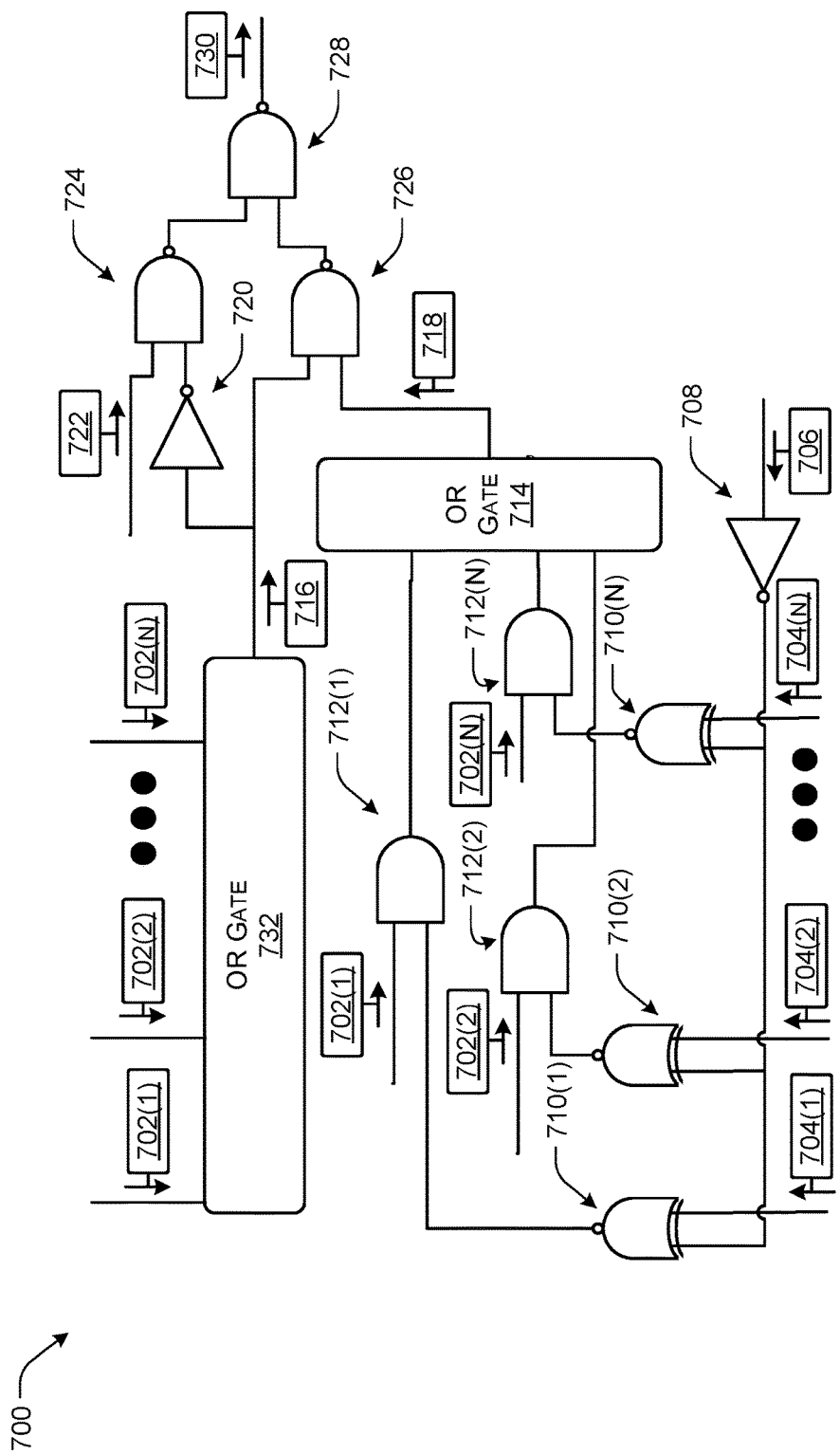
FIG. 7 illustrates a diagram showing an example component for setting an inversion bit according to some implementations.

FIG. 7 illustrates a diagram showing an example component 700 for setting an inversion bit according to some implementations. In the illustrated example, the inversion component 700 is configured to invert a state of each of the data bits being written into the memory array when a short is detected and the state of the data corresponding to the shorted bit is in the opposite state of the shorted bit cell. In this manner, the inversion component 700 is able to configure the state of the data bits such that at least one of the shorted bit cell stores data in a passing state.

In general, the inversion component 700 receives shorted bit data 702(1)-(N) associated with each bit cells (1)-(N) of the memory array being written, a state of the data bits 704(1)-(N) being written into each bit cell (1)-(N), and a passing state 706. In general, the shorted bit data 702(1)-(N) associated with each bit cell may be received by an OR gate 732, which outputs a high signal if at least one short is indicated by the shorted bit data 702(1)-(N).

The passing state 706 is inverted by inverter 708 and the inverted passing state and the state of the data bits 704(1)-(N) are received at a XNOR gate 710(1)-(N) corresponding to each of the data bits 704(1)-(N). The output of each of the XNOR gates 710(1)-(N) and the shorted bit data 702(1)-(N) are received at a corresponding AND gate 712(1)-(N). The output of each of the AND gates 712(1)-(N) are received by an OR gate 714.

The OR gate 732 outputs a first signal 716 indicating that at least one shorted bit cell is detected and the OR gate 714 outputs a second signal 718 indicating that the state to be stored in at least one of the shorted bit cells is the non-passing state (or a state that results in an output error when the bit cells (1)-(N) are read from the memory array). The first output signal 716 is inverted by inverter 720. The inverted first output signal 720 and a majority state 722 (e.g., one or zero) of the data bits 704(1)-(N) are received at NAND gate 724, while the first output signal 716 and the second output signal 718 are received at NAND gate 726. The output of both the NAND gate 724 and the NAND gate 726 are then received at NAND gate 728, which outputs an inversion state or a state of an inversion bit 730.

For instance, in one example, a first bit cell corresponding to the read data 704(1) of the memory array is a shorted bit cell fixed in the low resistive state (e.g., the passing state is the low resistive state or a state representative of the value of zero) and that the data bit 704(1) being written into the memory is in the high state or representative of a value of one. In this example, the first output signal 716 generated by the OR gate 732 is high. The passing state 706 is low, which is inverted to a high signal by inverted 708. The high state or inverted passing state 706 and the high value of the data bit 704(1) is received at XNOR gate 710(1), which outputs a high signal.

The AND gate 712(1), thus, received the high signal form the XNOR gate 710(1) and the high signal associated with shorted bit data 702(1) (e.g., the high value indicates a short on the first bit cell), which causes the AND gate 712(1) to output a high signal. The high output of the AND gate 712(1) causes the OR gate 714 to output a high signal, as the second output signal 718. Thus, the NAND gate 726 receives a high signal associated with both the first output signal 716 and the second output signal 718 and outputs a low signal.

The first output signal 716 is also inverted by inverter 720 to a low signal. The low signal and a majority state 722 are received by NAND gate 724. In general, the majority state 722 is used to set the inversion bit 730 when no shorts are detected. In this example, the first bit cell is shorted, so regardless of the majority state 722 (e.g., 0 or 1), the output of the NAND gate 724 is high. The high output of NAND gate 724 and the low output of NAND gate 726 are received by the NAND gate 728, which in turn sets the inversion bit 730 to indicate the state of each of the data bits 704(1)-(N) should be inverted before being stored in the memory array. In this manner, the high value of data bit 704(1) is stored as the passing state 706 (e.g., low resistive state) on the first bit cell and the error otherwise introduced by the first bit cell is avoided.

Figure 8:
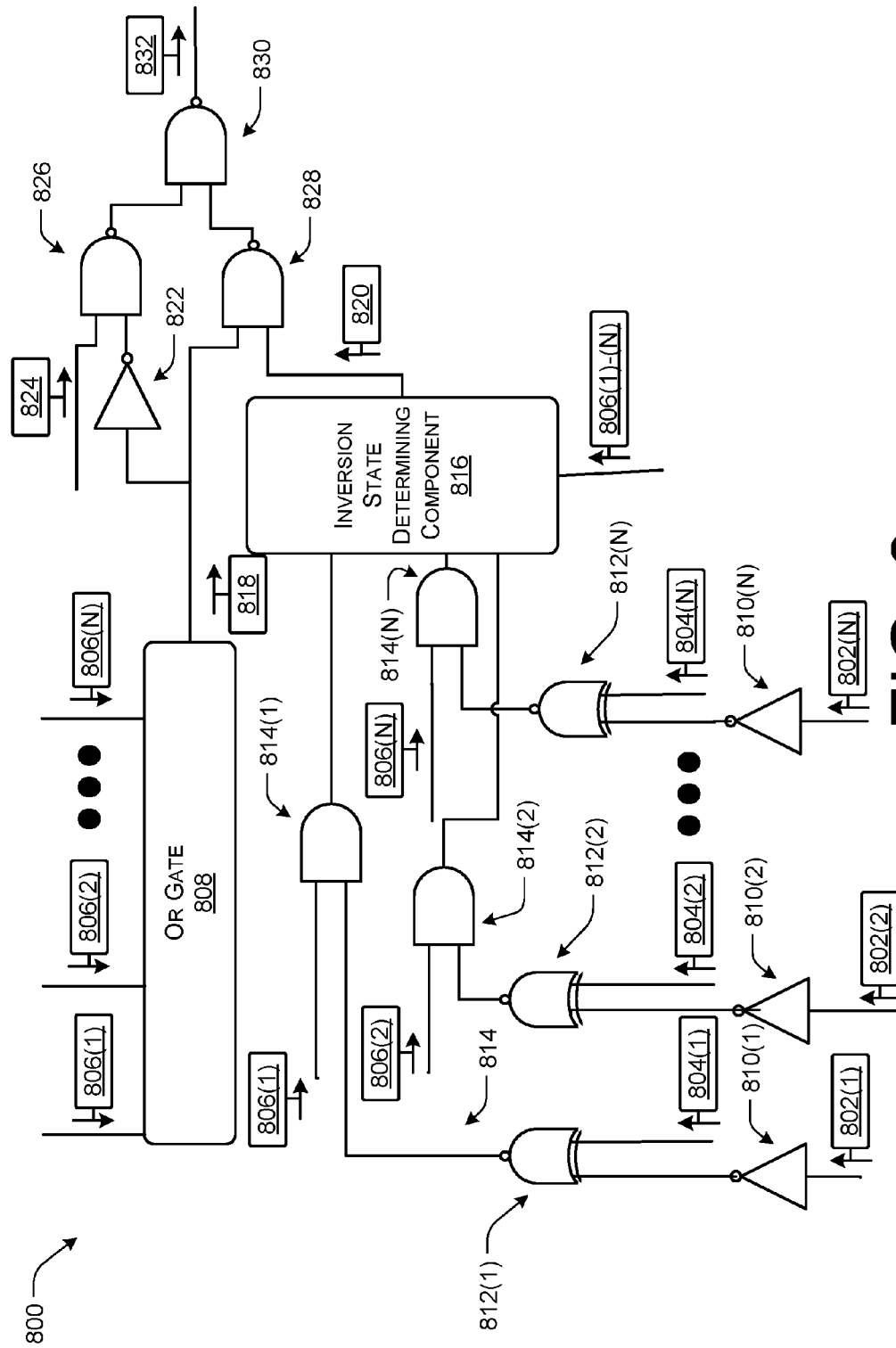
FIG. 8 illustrates a diagram showing an example component for setting an inversion bit according to some implementations.

FIG. 7 illustrates an example component 700 for setting an inversion bit to store data in at least one shorted bit cell in a passing state. FIG. 8 illustrates another example component 800 for setting the inversion bit to store data in a majority of the shorted bit cells in a passing state.

FIG. 8 illustrates a diagram showing an example component 800 for setting an inversion bit according to some implementations. In the illustrated example, the inversion component 800 is configured to invert the data bits being written into the memory array when a short is detected based in part a passing state 802(1)-(N) of each bit cell and the state of the data bits 804(1)-(N) being written to the bit cells. In this manner, the inversion component 800 is able to configure the state of the data bits such that a majority of the shorted bit cell store data in a passing state.

In general, the inversion component 800 receives shorted bit data 806(1)-(N) associated with each bit cells of the memory array being written, a state of the data bits 804(1)-(N) being written into each bit cell, and a passing state 802(1)-(N) (e.g., a state of the data (K) in which the shorted bit cell (K) outputs the data (K) correctly when accessed). In this implementation, the memory device is able to compensate for a portion of the shorted bit cells being fixed in the high resistive state and a portion of the shorted bit cells being fixed in the low resistive state.

For example, each bit cell may be comprised of pairs of tunnel junctions or magnetic tunnel junctions each of which may be configured to a high resistive state or a low resistive state. The state of each tunnel junction may then be sensed and compared by, for example, a sense amplifier and based on states of each of the tunnel junctions the sense amplifier may output a value (e.g., one or zero) associated with the bit cell. In this manner, if one of the pairs of tunnel junctions with a bit cell is shorted, the shorted state of the bit cell may be fixed in either a high resistive state or a low resistive state (even if the shorted tunnel junction is fixed in the low resistive state). Thus, in some implementations, the passing state of each bit cell may vary between a high value and a low value.

For instance, the shorted bit data 806(1)-(N) associated with each bit cell may be received by an OR gate 808. Each of the passing states 802(1)-(N) are inverted by one of the inverters 810(1)-(N) and the inverted passing state and the state of the data bits 804(1)-(N) are received at a XNOR gate 812(1)-(N) corresponding to each of the data bits 804(1)-(N). The output of each of the XNOR gates 812(1)-(N) and the shorted bit data 806(1)-(N) are received at a corresponding AND gate 814(1)-(N). The output of each of the AND gates 814(1)-(N) are received by an inversion state determining component 816, together with the shorted bit data 806(1)-(N).

The OR gate 808 outputs a first signal 818 indicating that at least one shorted bit cell is detected and the inversion state determining component 816 outputs a second signal 820 indicating an majority passing state for the shorted bit cells. The first output signal 818 is inverted by inverter 822. The inverted first output signal 818 and a majority state 824 (e.g., one or zero) of the data bits 804(1)-(N) are received at NAND gate 826, while the first output signal 818 and the second output signal 820 are received at NAND gate 828. The output of both the NAND gate 826 and the NAND gate 828 are then received at NAND gate 830, which outputs an inversion state or a state of an inversion bit 832.

For instance, in one example, a first bit cells corresponding to shorted bit data 604(1) and a second bit cells corresponding to shorted bit data 604(2) of the memory array are shorted bit cell fixed in the low resistive state (e.g., the passing state is the low resistive state or a state representative of the value of zero) and that the data bit 804(1) and (2) being written into the memory are in the high state or representative of a value of one. In this example, the nth bit cell corresponding to shorted bit data 604(N) of the memory array is also a shorted bit cell fixed in the low resistive state (e.g., the passing state is the low resistive state or a state representative of the value of zero) and that the data bit 804(N) being written into the memory is in the low state or representative of a value of zero.

In this example, the first output signal 818 generated by the OR gate 808 is high, as shorted bit cell data 806(1)-(N) indicates at least three shorted bit cells. The output of the XNOR gate 812(1) is high, as data bit 804(1) is high and the inverted passing state 802(1) is high, the output of the XNOR gate 812(2) is high, as data bit 804(2) is high and the inverted passing state 802(2) is high, and the output of the XNOR gate 812(N) is low, as data bit 804(N) is low and the inverted passing state 802(N) is high.

The output of AND gate 814(1) is high, as the output of NAND gate 812(1) is high, the output of AND gate 814(2) is high, as the output of NAND gate 812(2) is high, and the output of AND gate 814(N) is low, as the output of NAND gate 812(1) is low and the shorted bit data 806(1), (2), and (N) are all high. Thus, the input to the inversion state determining component 816, for at least the shorted bit cells 806(1), (2), and (N), is high, high, low and the shorted bit cell data 806(1), 806(2), and 806(6) are all high. The second output signal 820 is high, as a majority of the shorted bit cells require inversion to pass (e.g., two high signals and one low signal).

In this example, the NAND gate 828 has a low output, as the first output signal 818 is high and the second output signal 820 is high. The output of the NAND gate 826 is high, as the inverted first output signal 818 is low. The high output of NAND gate 826 and the low output of NAND gate 726 are received by the NAND gate 830, which in turn sets the inversion bit 832 to indicate a state of each of the data bits 804(1)-(N) should be inverted before being stored in the memory array. In this manner, the high value of data bit 804(1) is stored as a low value or the passing state 802(1) on the first shorted bit cell, and the high value of the data bit 804(2) is also stored as a low value or the passing state 802(2). Thus, in this example, the memory device is able to compensate for two out of three shorted bit cells. In some cases, the error correction component incorporated into the memory device may be able to correct for the error introduced by the third shorted bit cell.

Figure 9:
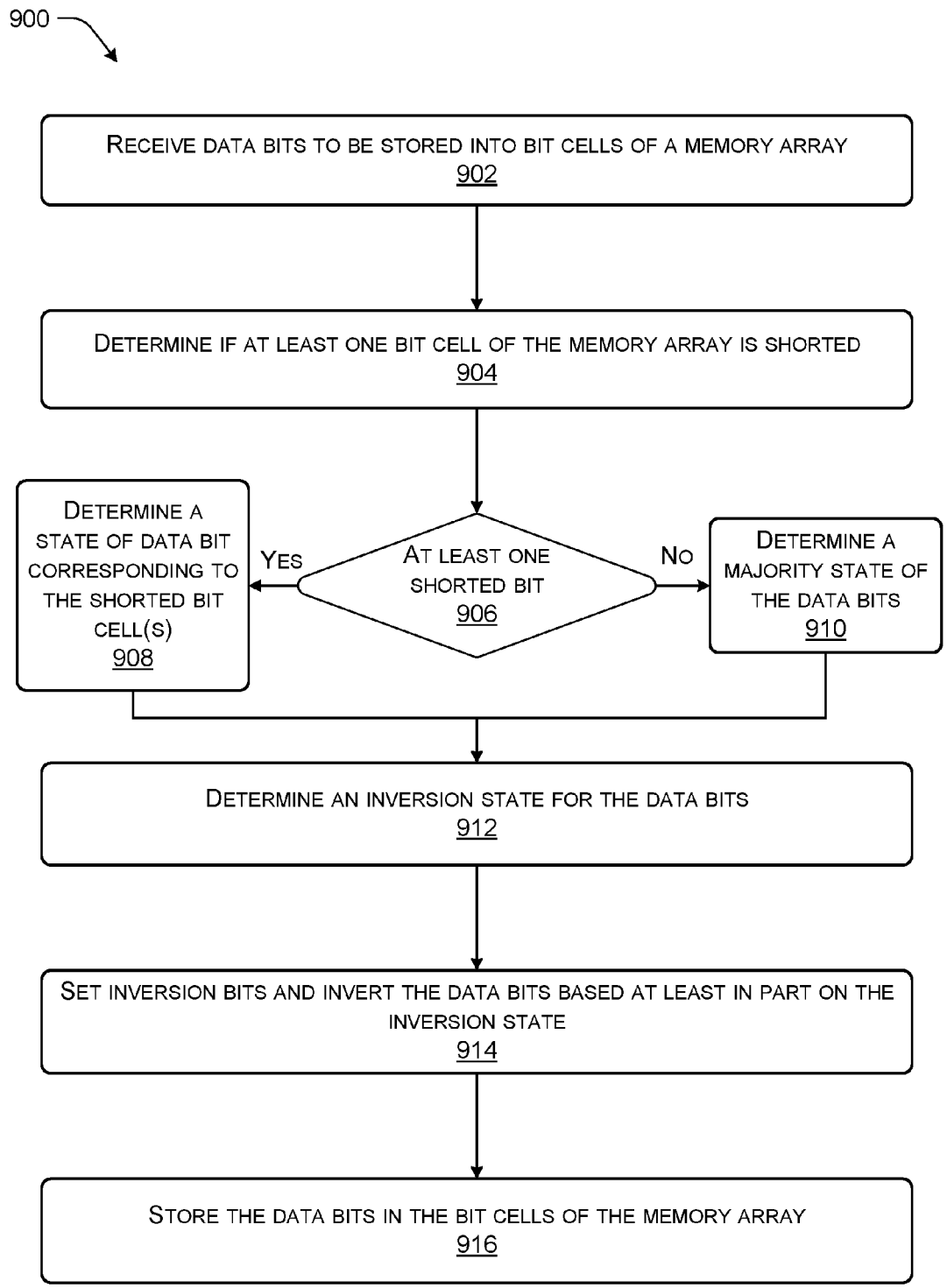
FIG. 9 illustrates an example flow diagram showing an illustrative process related to writing data into the memory array according to some implementations.

FIGS. 9 and 10 are flow diagrams illustrating example processes of associated with accessing data stored in a memory device according to some implementations. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 9 illustrates an example flow diagram showing an illustrative process 900 related to writing data into the memory array according to some implementations. In some instances, one or more bit cells of the memory array may be shorted, for example, due to dielectric breakdown of the tunnel junction associated with the particular bit cell. In these cases, the shorted bit cell may introduce an error when the data is read from the memory array. Thus, as described herein, the process 900 provides one example to prevent the shorted bit cell from causing an error when the data is read.

At 902, the memory device receives data to be stored into bit cells of the memory array. For example, the memory device may have received a precharge command or a write back command to load the data bits stored in the cache (or other temporary storage) into the bit cells of the memory array.

At 904, the memory device determines if at least one bit cell of the memory array is shorted. For instance, the memory device may include one of the short detection components described with respect to FIGS. 4-6 above. In one example, the memory device may include a short detection component configured to identify a shorted bit cell based at least in part on a reference data, read data associated with the bit cells of the memory array, and/or error data received from an error correction component. If at 904, the memory device identified at least one shorted bit cell, the process 900 proceeds from 906 to 908. Otherwise, if at 904, the memory device does not identify at least one shorted bit cell, the process 900 proceeds from 906 to 910.

At 908, the memory device determines a state of the data bit corresponding to the shorted bit cell. For example, the memory device, for example via a short detection component or an inversion component, may identify the fixed state associated with the shorted bit cell (e.g., either high resistive state or low resistive state) and a state of the data bit being stored in the shorted bit cell.

At 910, the memory device performs a majority detection on the data bits to determine the most common bit value. For instance, a majority detection component may determine if the data bits include more bits having a value of one (or a high state) or a value of zero (or a low state). In some cases, in addition to the value of the data bits, the majority detection component may consider the value of parity bits when determining the majority state.

At 912, the memory device determines an inversion state for the data. If no shorted bit cells were detected at 906, the memory device inverts based on the majority state. For instance, in one example, the memory device may implement self-referenced reads in which the resistive state of each bit cell is set to a predetermined state when the data is read from the array. In this example, the memory device may select an inversion state based on the majority state and the predetermined state. In other words, when no shorted bit cells are present, the memory device may determine the state of the data (e.g., inverted or non-inverted) to reduce the number of bit cells that changed state. However, if at least one shorted bit cell is identified at 906, the memory device may selected an inversion state for the data based on the fixed state of the bit cell and the state of the data bit corresponding to the shorted bit cell. For example the memory device may select the inversion state to ensure the data stored in the shorted bit cell matches the shorted state. For example the memory device may select the inversion state to ensure the data stored in the shorted bit cell results in fewer errors (e.g., if the state of the data bits match more of the fixed states of the shorted bits when inverted or when stored in the original state).

At 914, the memory device sets the inversion bits and inverts the data based at least in part on the inversion state selected. For example, if the data is stored in the original or non-inverted state, an inversion bit may be set to the low resistive state. Alternatively, if the data is stored in the inverted state, the inversion bit may be set to the high resistive state and the state of each bit of the data may be switched.

At 916, the memory device stores the data in the bit cells of the memory array. For example, the memory device may store the inverted data bits or the data bits depending on the presence of a shorted bit cell and/or the majority detection described above.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory device comprising:
   a memory array including a plurality of bit cells, wherein each bit cell of the plurality of bit cells is configured to switch between a first state and a second state;
   a sense amplifier configured to read data associated with a state of each of the plurality of bit cells;
   a detection circuit configured to receive the read data from the sense amplifier and identify at least one bit cell of the plurality of bit cells fixed in one of the first or second states; and
   an inversion circuit configured to:
   determine that a state of a data bit to be stored in the at least one bit cell differs from the fixed state of the at least one bit cell;
   invert the data bit, in response to determining that the state of the data differs from the fixed state of the at least one bit cell; and
   set an inversion bit, in response to inverting the data bit.

2. The memory device as recited in claim 1, wherein the fixed state of the at least one bit cell is in one of a high resistive state or a low resistive state.

3. The memory device as recited in claim 1, wherein:
   the at least one bit cell includes at least three bit cells; and
   the inversion circuit is further configured to:
   determine a majority state associated with a plurality of data bits to be stored in the at least three bit cells, and
   invert a state of each of the plurality of data bits based at least in part on the majority state determination.

4. The memory device as recited in claim 1, wherein the detection circuit is configured to identify the at least one bit cell based at least in part on a voltage generated by a reference resistance.

5. The memory device as recited in claim 4, wherein the detection circuit is configured to identify the at least one bit cell based at least in part on a sample voltage.

6. The memory device as recited in claim 1, wherein the inversion circuit is configured to invert a plurality of data bits to be stored in the memory array based at least in part on a state of the at least one bit cell.

7. The memory device as recited in claim 1, wherein the inversion circuit is configured to invert a plurality of data bits to be stored in the memory array based at least in part on a number of matches identified by comparing a fixed state of each of the at least one bit cell and the state of the data bit of the plurality of data bits to be stored in each of the at least one bit cell.

8. The memory device as recited in claim 1, further comprising an error correction circuit configured to provide error data to the detection circuit, and wherein the detection circuit is configured to identify the at least one bit cell based at least in part on the error data.

9. The memory device as recited in claim 1, wherein the sense amplifier is configured to provide the read data to the inversion circuit, and wherein the detection circuit is configured to identify the at least one bit cell based at least in part on the read data.

10. A method comprising:
    receiving a plurality of data bits to be stored in a memory array, wherein the memory array includes a plurality of bit cells, and wherein each bit cell of the plurality of bit cells is configured to switch between a first state and a second state;
    identifying a first bit cell of the plurality of bit cells fixed in one of the first or second states;
    determining a state of the first bit cell;
    identifying a first data bit of the plurality of data bits to be stored in the first bit cell;
    determining a state of the first data bit;
    determining that the state of the first bit cell and the state of the first data bit are different;
    in response to determining that the state of the first bit cell and the state of the first data bit are different, inverting the plurality of data bits and setting an inversion bit; and
    storing the plurality of inverted data bits and the inversion bit in the memory array.

11. The method as recited in claim 10, wherein the state of the first data bit is a high state and the state of the first bit cell is a low state.

12. The method as recited in claim 10, wherein the state of the first data bit is a low state and the state of the first bit cell is a high state.

13. The method as recited in claim 10, wherein the first bit cell is identified based at least in part on a reference resistance.

14. The method as recited in claim 10, wherein the first bit cell is identified based at least in part on a voltage reference.

15. The method as recited in claim 10, further comprising preventing a write voltage from being applied to a second bit cell when the state of the first data bit differs from a state of a second data bit, the second data bit to be stored in the second bit cell.

16. A method comprising:
   receiving data to be stored in a memory array, the data including a plurality of data bits, a first portion of the plurality of data bits having a first state, and a second portion of the plurality of data bits having a second state;
   identifying at least one fixed-state bit cell in the memory array;
   identifying a data bit targeted for storage in the at least one fixed-state bit cell;
   determining a state of the data bit; and
   storing the plurality of data bits in the memory array, wherein the step of storing the plurality of data bits includes:
   (i) storing the plurality of data bits when the state of the data bit is the first state; or
   (ii) inverting a state of each of the plurality of data bits, setting an inversion bit, and storing the plurality of inverted data bits and the inversion bit in the memory array when the state of the data bit is the second state.

17. The method as recited in claim 16, wherein the at least one fixed-state bit cell is a differential bit cell.

18. The method as recited in claim 16, further comprising:
   identifying a majority state associated with the data when the state of the data bit to be stored in the fixed-state bit cell is the first state; and
   inverting the data when the majority state is the second state, prior to storing the data in the memory array.

19. The method as recited in claim 16, wherein the at least one fixed-state bit cell is identified based at least in part on a reference resistance.

20. The method as recited in claim 16, wherein the at least one fixed-state bit cell is identified based at least in part on a voltage reference.

* * * * *